United States Patent [19]

Choi

[11] Patent Number: 6,025,237
[45] Date of Patent: Feb. 15, 2000

[54] METHODS OF FORMING FIELD EFFECT TRANSISTORS HAVING GRADED DRAIN REGION DOPING PROFILES THEREIN

[75] Inventor: Young-Suk Choi, Inchun-shi, Rep. of Korea

[73] Assignee: Fairchild Korea Semiconductor, Ltd., Kyungki-do, Rep. of Korea

[21] Appl. No.: 08/947,091

[22] Filed: Oct. 8, 1997

[30] Foreign Application Priority Data

Mar. 24, 1997 [KR] Rep. of Korea ................. 97-10043

[51] Int. Cl.[7] .................................................. H01L 21/336
[52] U.S. Cl. ...................... 438/301; 438/232; 257/335; 257/342
[58] Field of Search .................................. 438/232, 301, 438/308; 257/335, 342; 148/DIG. 126

[56] References Cited

U.S. PATENT DOCUMENTS

| | | | |
|---|---|---|---|
| 5,231,041 | 7/1993 | Arima et al. | 438/257 |
| 5,369,045 | 11/1994 | Ng et al. | 437/41 |
| 5,373,177 | 12/1994 | Kitaoka | 257/306 |
| 5,378,912 | 1/1995 | Pein | 257/335 |
| 5,559,044 | 9/1996 | Williams et al. | 438/234 |

*Primary Examiner*—John F. Niebling
*Assistant Examiner*—John Murphy
*Attorney, Agent, or Firm*—Myers Bigel Sibley and Sajovec

[57] ABSTRACT

Methods of forming field effect transistors include the steps of implanting first conductivity type dopants at a first dose level into a first portion of a relatively lightly doped drift region of first conductivity type semiconductor and then oxidizing the first portion of the semiconductor drift region to form a relatively thick field oxide isolation region and simultaneously form a drain region extension of first conductivity type semiconductor (e.g., $N^0$) underneath the field oxide isolation region by driving the dopants implanted at the first dose level into the drift region. A body region of second conductivity type semiconductor (e.g., P-type) is then formed in a second portion of the semiconductor drift region. A gate electrode is then formed on the drift region to extend opposite the body region and the field oxide isolation region. Source and drain regions of first conductivity type semiconductor (e.g., N+) are then formed in the body region and in a third portion of the drift region spaced from the second portion, respectively, by implanting first conductivity type dopants at a second dose level using the gate electrode and field oxide isolation region as an implant mask. The third portion of the drift region overlaps the first portion of the drift region so that a composite drain region having a laterally graded doping profile can be formed. The first portion of the drift region preferably extends between the third and second portions so that the doping profile of the drain region (e.g., N+) and drain region extension (e.g., $N^0$) monotonically decreases in a direction towards the body region.

13 Claims, 7 Drawing Sheets

METHODS OF FORMING FIELD EFFECT TRANSISTORS HAVING GRADED DRAIN REGION DOPING PROFILES THEREIN

FIELD OF THE INVENTION

The present invention relates to methods of forming semiconductor switching devices and devices formed thereby, and more particularly to methods of forming field effect transistors and field effect transistors formed thereby.

BACKGROUND OF THE INVENTION

Future intelligent power ICs will require high-density power devices along with analog functions and VLSI logic. DMOS transistors are important in power device applications capable of handling high voltages. For such devices, one figure of merit is the current handling capacity per unit area or the ON resistance per unit area. For a given voltage rating, the ON resistance per unit area may be reduced by reducing the cell area of the MOS device.

In the field of power transistors, the combined width of the polycrystalline silicon (polysilicon) and the contact region, which forms the gate and source electrode, respectively, is defined as the cell pitch of the device. For a DMOS power transistor, a known technique to reduce the width of the polysilicon region is to decrease the P-well junction depth. However, minimum junction depth is defined by the breakdown voltage required.

A conventional structure Lateral DMOS (LDMOS) device is well suited for incorporation into VLSI processes because of its simplicity. However, LDMOS devices have been considered inferior to Vertical DMOS (VDMOS) devices, and therefore have not received significant attention. Recently, a RESURF (Reduced SURface Field) LDMOS device with good specific on-resistance ($R_{sp}$) has been demonstrated. But that device structure is more complex and not very versatile, being limited to grounded source applications.

More specifically, in the past, DMOS transistors have been utilized either as discrete power transistors or as components in monolithic integrated circuits. DMOS transistors are inherently conservative of semiconductor substrate area because of the manner in which they are fabricated in a self-aligned fabrication sequence.

A channel body region is usually first formed by dopant introduction of one type dopant (P or N impurities) through an aperture in a mask of gate-forming material to provide a channel region which is self-aligned with the gate. Then a source region is usually formed by dopant introduction of a type opposite to that of the channel body region through the existing aperture so that the source is self-aligned to both the gate electrode and the channel body region. This permits a very compact structure.

Referring to FIG. 1, an LDMOS transistor device 10 of the prior art is illustrated. The device 10 includes two lateral double diffused metal oxide semiconductor (LDMOS) transistors 10a and 10b. The transistor device 10a is formed on a semiconductor-on insulator (SOI) substrate which has a silicon substrate 11, a buffer oxide layer 12 and a semiconductor layer 14. The semiconductor layer 14 is illustrated as overlying the silicon substrate 11. The field effect transistor of the conventional device comprises an N-type source region 16a and a drain region 18a. The source region 16a is formed in a well region 20 of P-type conductivity. The well region 20 is often referred to as a P-type body region. The P-type body region 20 can extend through the layer 14 to an upper surface of the buffer oxide 12 or, alternatively, the body region 20 can be fully within the layer 14 as illustrated.

The drain region 18a is adjacent to the other end of the field insulating region 23a. The field insulating region 23a comprises oxide such as thermally grown silicon dioxide, for example. A gate electrode 26a is also formed over the surface of layer 14. The gate electrode 26a extends from over a portion of the source region 16a to over a portion of the field insulating region 23a. The gate electrode 26a may comprise a layer of doped polysilicon. The gate electrode 26a is separated from the surface of layer 14 by a gate dielectric layer 28a. The gate dielectric layer 28a may comprise a layer of oxide or a layer of nitride or a composite of an oxide layer (O) and a nitride layer (N) (e.g., a stacked NO or ONO layer). Sidewall insulating regions (not shown) may be formed on the sidewalls of gate electrode 26a. The sidewall insulating regions typically comprise an oxide material such as silicon dioxide or a nitride material such as silicon nitride. A more heavily doped body region 30 is also provided in the P-type body region 20. The more heavily doped body region 30 is typically provided to allow good ohmic contact to the P-type body region 20 and is typically more heavily doped than the P-type body 20. Drain and source contacts 32a and 34, respectively, are also included so that electrical contact can be made to the drain and source regions 18a and 16a. In FIG. 1, a single source contact 34 is used for the source regions 16a and 16b of both transistors 10a and 10b. A device similar to the device of FIG. 1 is disclosed in U.S. Pat. No. 5,369,045 to Ng, et al.

Referring now to FIG. 2, another LDMOS transistor device 70 according to the prior art is illustrated. This device 70 includes a silicon substrate 71, typically of N-type silicon material having a constant doping concentration, on which is provided a buried insulating layer 72. The buried insulating layer 72 is typically a silicon oxide layer of between about 0.1 micron and 5.0 microns in thickness. A semiconductor layer 74 such as an N-type silicon layer having a thickness of about 0.3 microns to 3.0 microns, is provided on the buried insulating layer 72. Preferably, the semiconductor layer 74 may have a substantially linearly graded lateral doping profile with a different doping concentration at its left (source) side than at its right (drain) side. A lateral semiconductor device such as an LDMOS transistor, is provided in the semiconductor layer 74. Other types of lateral semiconductor devices that may be provided in the semiconductor layer 74 include lateral insulated-gate bipolar transistors (LIGBT), lateral thyristors and lateral high voltage diodes.

The LDMOS transistor shown in FIG. 2 includes an N-type source region 76 having a high doping concentration therein of greater than $10^{15}$ cm$^{-3}$, a P-type channel region 78 having a doping concentration therein at the surface of between $10^{16}$ and $5 \times 10^{17}$ cm$^{-3}$, and an N-type drain region 80 which has an N-type doping concentration therein of greater than $10^{15}$ cm$^{-3}$. In a manner well known to those skilled in the art, a field insulating layer, such as a LOCOS (Local Oxidation of Silicon) oxide layer 82, is provided in and on the semiconductor layer 74 between the source and drain regions. A thinner gate oxide insulating layer 84 is preferably provided over the channel region and a portion of the source region 76. The field insulating layer 82 may typically be about 0.5–2.0 microns thick and the thinner gate oxide may be about 0.03–0.1 microns thick. A gate electrode 86 which may comprise polysilicon is provided on the field insulating layer 82 and the gate oxide 84. The source electrode 88a and the drain electrode 88b which may comprise aluminum or other suitable metal, are also provided over the source and drain regions, respectively.

As illustrated by FIG. 2, the channel region 78 and drain region 80 are electrically coupled by a thin lateral drift region 77 having a substantially linearly graded lateral doping profile as described above. As shown by FIG. 2, the drift region 77 is formed on a portion of the semiconductor layer 74 and is of N-type silicon material. The drift region 77 is covered by the field oxide 82 over the major portion of its length, with a part of the gate electrode 86 covering a major portion of the field oxide 82. The device of FIG. 2 offers excellent high voltage performance, but typically suffers from a number of drawbacks. First, a compromise typically must be made between the obtainable breakdown voltage and on-resistance. Other electrical characteristics, such as thermal conductivity and dielectric constant, are also typically not optimized. A device similar to the device of FIG. 2 is disclosed in U.S. Pat. No. 5,378,912 to Pein.

The devices of FIGS. 1 and 2 typically have a relatively high on-state resistance compared to other LDMOS transistor devices having drift regions with linearly graded doping profiles. This is because the drift region of the conventional LDMOS device is composed of a single doping profile. In order to prevent the withstand voltage from being lowered, it is typically necessary to increase the area of a drift region between the P-type body and the drain contact. However, increasing the area of the drift region typically increases the size of the device and reduces integration levels. In addition, a relatively long duration process step is required to form a heavily doped drain contact region directly in a semiconductor layer because N-type impurity ions of heavy concentration typically have to be diffused into an undoped semiconductor layer. In addition, the drift region of the conventional LDMOS transistor is composed of a semiconductor layer having a single doping profile. Accordingly, if a relatively large drain voltage is applied to the completed LDMOS device, an electric field is concentrated adjacent to the drain region and increases the likelihood of punch-through and decreases the withstand voltage.

SUMMARY OF THE INVENTION

It is therefore an object of the present invention to provide improved methods of forming field effect transistors for high power applications and field effect transistors formed thereby.

It is another object of the present invention to provide methods of forming field effect transistors having high withstand voltage capability and field effect transistors formed thereby.

It is still another object of the present invention to provide methods of forming field effect transistors having low on-state resistance and field effect transistors formed thereby.

These and other objects, advantages and features of the present invention are provided by methods of forming lateral field effect transistors which include the steps of implanting first conductivity type dopants at a first dose level into a first portion of a relatively lightly doped drift region of first conductivity type semiconductor and then oxidizing the first portion of the semiconductor drift region to form a relatively thick field oxide isolation region and simultaneously form a drain region extension of first conductivity type semiconductor (e.g., $N^0$) underneath the field oxide isolation region by driving the dopants implanted at the first dose level into the drift region. A body region of second conductivity type semiconductor (e.g., P-type) is then formed in a second portion of the semiconductor drift region that is spaced from the first portion. A gate electrode is then formed on the drift region to extend opposite the body region and the field oxide isolation region. Source and drain regions of first conductivity type semiconductor (e.g., N+) are then formed in the body region and in a third portion of the drift region spaced from the second portion, respectively, by implanting first conductivity type dopants at a second dose level using the gate electrode and field oxide isolation region as an implant mask. The third portion of the drift region overlaps the first portion of the drift region so that a composite drain region having a laterally graded doping profile can be formed. In particular, the first portion of the drift region preferably extends between the third and second portions so that the doping profile of the drain region (e.g., N+) and drain region extension (e.g., $N^0$) monotonically decreases in a direction towards the body region. To achieve this preferred graded doping profile in the drain region, the step of forming source and drain regions comprises implanting first conductivity type dopants at a second dose level that is greater than the first dose level.

According to other aspects of the present invention, the step of implanting first conductivity type dopants at a first dose level is preceded by the step of forming a gate oxide layer on a surface of the drift region and the step of forming the body region is preceded by the step of forming a gate conductive layer having an opening therein that extends opposite the second portion of the drift region, on the gate oxide layer and field oxide isolation region. According to this aspect of the present invention, the step of forming the body region comprises implanting dopants of second conductivity type at a third dose level into the drift region using the gate conductive layer as an implant mask. In addition, the step of forming a gate electrode comprises patterning the gate conductive layer to expose a portion of the gate oxide layer extending opposite the third portion of the drift region. The step of forming source and drain regions is also preferably preceded by the step of patterning a layer of photoresist on the gate oxide layer, in the opening that extends opposite the second portion of the drift region. This patterned layer of photoresist is then removed from the opening and then implanting dopants of second conductivity type at a fourth dose level (greater than the third dose level) into the body region to define a contact region of second conductivity type (e.g., P+) therein.

According to still other aspects of the present invention, the lateral field effect transistors according to the present invention are formed in semiconductor-on-insulator (SOI) substrates. Thus, the step of implanting first conductivity type dopants at a first dose level is preceded by the step of forming an SOI substrate containing a semiconductor substrate, a buffer oxide layer on the semiconductor substrate and a drift region of first conductivity type semiconductor of predetermined thickness on the buffer oxide layer, opposite the semiconductor substrate. Here, the step of implanting first conductivity type dopants at a first dose level may be preceded by the steps of forming a trench extending through the drift region to expose the buffer oxide layer; lining the trench with an electrically insulating layer and then filling the trench with an electrically conductive layer. The step of implanting first conductivity type dopants at a first dose level may also be preceded by the steps of implanting first conductivity type dopants at a fifth dose level into the first portion of the drift region and then driving the dopants implanted at the fifth dose level into the drift region to form a drift region extension therein. The drift region and drift region extension collectively form a region having a laterally graded doping profile which decreases monotonically in a direction towards the body region of second conductivity type.

According to another embodiment of the present invention, lateral field effect transistors are provided that comprise a buffer oxide layer and a drift region of first conductivity type semiconductor on the buffer oxide layer. A body region of second conductivity type semiconductor is also provided in the drift region and forms a first P-N junction therewith. A drift region extension of first conductivity type is provided in the drift region. The drift region extension adjoins the buffer oxide layer and forms a non-rectifying junction with the drift region at a location spaced from the first P-N junction. The drift region extension has a first conductivity type doping concentration therein that decreases monotonically in a direction towards the body region and the buffer oxide layer. Source and drain regions of first conductivity type are also provided in the body region and drift region extension, respectively, and a gate electrode is provided to extend opposite the drift and body regions. The preferred field effect transistor also preferably includes a field oxide isolation region which extends between the drain region and the body region. A drain region extension of first conductivity type is also provided which adjoins the field oxide isolation region and has a higher average first conductivity type doping concentration therein than the drift region extension and a lower average first conductivity type doping concentration therein than the drain region. Preferably, the drain region extension forms a non-rectifying junction with the drain region, the drift region extension and the drift region. The body region may also adjoin the buffer oxide layer.

DESCRIPTION OF PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. It will also be understood that when a layer is referred to as being "on" another layer or substrate, it can be directly on the other layer or substrate, or intervening layers may also be present. In addition, the terms "first conductivity type" and "second conductivity type" refer to opposite conductivity types and each embodiment described herein includes its complementary embodiment as well.

Figure 1:
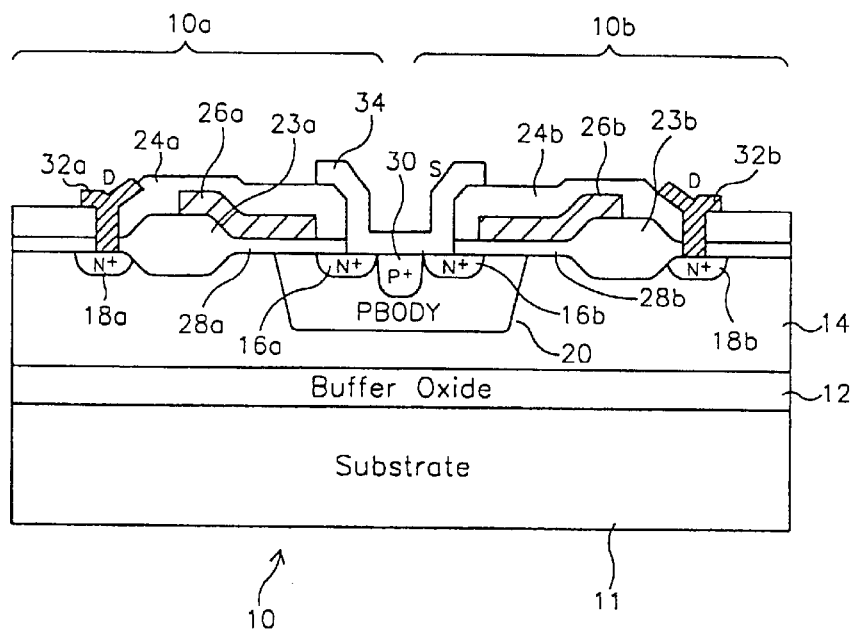
FIG. 1 is a cross-sectional view of a first LDMOS transistor according to the prior art.
Figure 2:
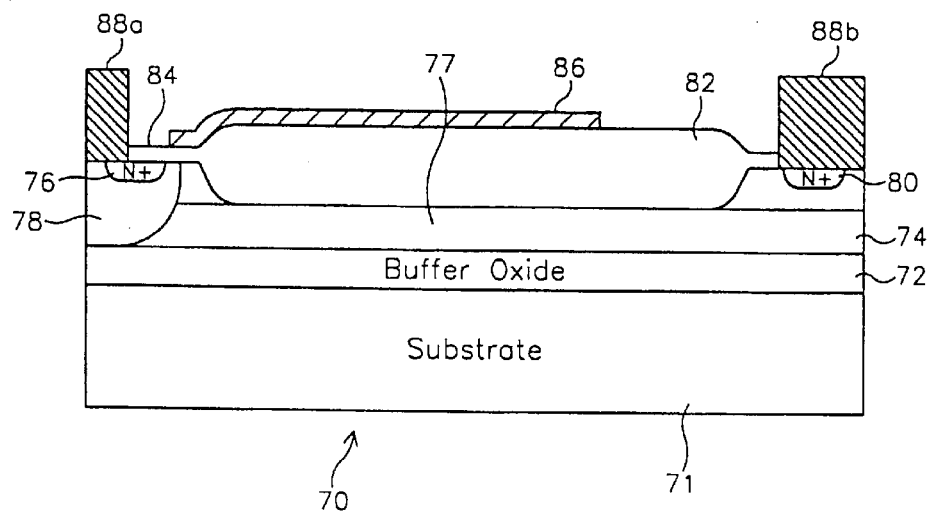
FIG. 2 is a cross-sectional view of a second LDMOS transistor according to the prior art.
Figure 3:
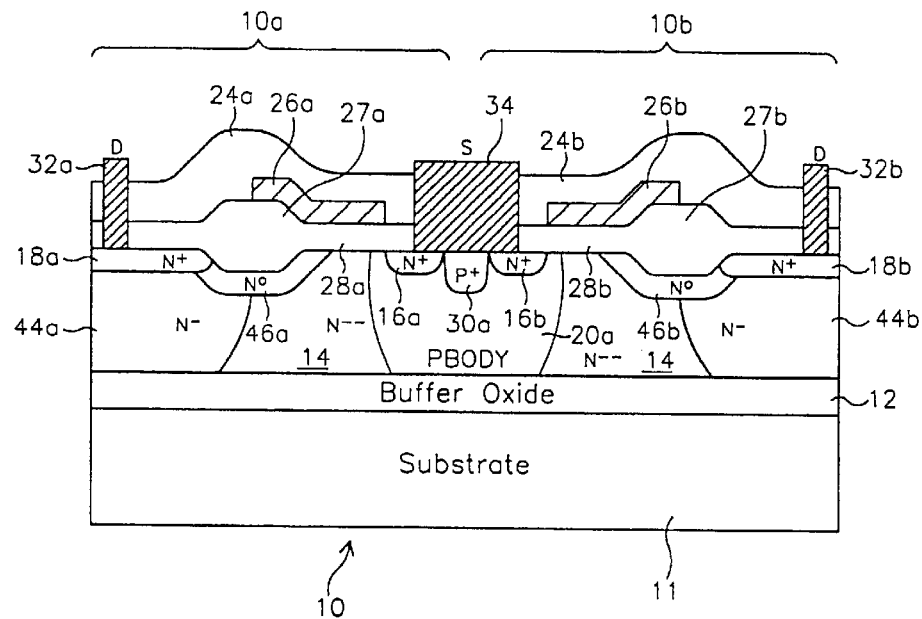
FIG. 3 is a cross-sectional view of a semiconductor switching device according to a first embodiment of the present invention.

Referring to FIG. 3, a novel LDMOS transistor device 10 includes two lateral double diffused metal oxide semiconductor (LDMOS) transistors 10a and 10b. For the following description, only one of the transistors 10a and 10b will be thoroughly described, however this description applies to both transistors. In particular, a novel lateral DMOS transistor device 10 in accordance with the present invention comprises a drift region having a linearly graded doping profile therein. This profile is composed of an N-- region 14 at its left side and a more highly doped N-region 44b at its right side. Substantially, the N-- region 14 is formed by the semiconductor layer itself and the N- region 44b is formed by diffusing impurity ions of a very low doping concentration into the semiconductor layer. The device can have a high breakdown voltage because the drift region having a linearly graded doping profile therein is longer than that of a conventional drift region having a uniform doping profile, and therefore the drift region of the present invention is suitable for power device applications.

The transistor device 10 also comprises a drift region having a linearly graded doping profile which is formed in the semiconductor layer and which is comprised of the N-- region 14 at its left side, the N- region 44b at its right side, an NO region 46b at the junction between regions 14 and 44b, and an N+ region 18b on the N- region 44b. As a result, the device 10 can have high carrier mobility and the operation speed of the device 10 can be significantly enhanced. The process time required for forming the drain region can be considerably reduced because the drain region has a linearly graded doping profile. The N+ region 18b is preferably doped with a dopant at a relatively high concentration relative to the $N^0$ region 46b.

The transistor device 10 may be formed on a semiconductor-on insulator (SOI) substrate which has a silicon substrate 11, a buffer oxide layer 12 on the silicon substrate 11, and a semiconductor layer 14 on the buffer oxide layer 12. The semiconductor layer 14 is illustrated as overlying the silicon substrate 11. The field effect transistor comprises a source region 16b and a drain region 18b. The N doped source region 16b is formed in a P doped well region 20a. The well region 20a is often referred to as a PBODY region. The PBODY region 20a can extend through the semiconductor layer 14 to an upper surface of the buffer oxide 12 as illustrated, or alternatively, it can be fully within the layer 14. The N+ drain region 18b is adjacent to the other end of the field insulating region 27b. The field insulating region 27b comprises a relatively thick field oxide such as thermally grown silicon dioxide.

A gate electrode 26b is formed opposite the layer 14, as illustrated. The gate 26b extends from over a portion of source 16b to over a portion of the field insulating region 27b. The gate 26b may comprise doped polysilicon. The gate is separated from the surface of layer 14 by a gate dielectric 28b. The gate dielectric 28b may comprise either an oxide or a nitride or a combination of both (e.g., a stacked NO or ONO layer). Sidewall insulating regions (not shown) may also be formed on the sidewalls of gate electrode 26b. The sidewall regions typically comprise an oxide material such as silicon dioxide or a nitride material such as silicon nitride.

A more heavily doped body contact region 30a is also illustrated in FIG. 3. The body contact region 30a may be included to allow good contact to the PBODY 20a. The body contact region 30a is typically more heavily doped than the PBODY 20a. Source/drain contacts 32b and 34 are also included in the transistor device 10. The source contact 34 is provided to electrically couple the source region 16b to other components in the circuit, and the drain contact 32b is provided to electrically couple the drain region 18b to other components in the circuit. The contacts 32b and 34 are formed from a conductive material, typically a metal such as aluminum, copper or gold. Other materials such as doped polysilicon or a silicide such as titanium silicide or tungsten suicide may also be used to form contacts 32b and 34. In FIG. 3, a single contact 34 is used for both source regions 16a and 16b of both transistors 10a and 10b. Alternatively, two separate contacts could be used if it was desirable to couple each of the source regions to a different component in the circuit.

Also, in addition to the heavily doped region 18b (hereinafter, referred to as "drain region") as well as the semiconductor layer 14 (hereinafter, referred to as "drift region"), the transistor device further comprises a drift region extension 44b which is formed under the drain region 18b and which is doped with N-type impurity lighter in concentration than the drain region 18b and heavier in concentration than the drift region 14, and a drain region extension 46b which extends from an end of the drain region 18b and is formed covering the bottom of a field oxide isolation region 27b. The drain region extension 46b is doped with $N^0$ impurity heavier than the drift region extension 44b and lighter than the drain region 18b. As described immediately above, the drain and drift regions of the transistor device have linearly graded doping profiles. In addition, the bottom of the field oxide 27b is formed as a round-shaped structure which is grown toward the depth direction of the semiconductor layer 14 by thermal oxidation, and the $N^0$ drain region extension 46b is formed along the bottom of the field oxide 27b. Thus, when a high voltage is applied to the transistor device 10, any electric field apt to be concentrated adjacent the drain region is dispersed outwardly by the field oxide 27b which is located between the PBODY 20a and the drain region 18b. As a result, the withstand voltage of the device can be further improved. Furthermore, in order to prevent the field oxide 27b from exerting a bad influence on the other electrical characteristics of the device 10 (e.g., the current handling capacity of the device 10), the device of the present invention has a current path for electrically connecting the N-- region 14 and the $N^0$ region by the N- region 44b which is also formed to extend under the field oxide 27b. As a result, the current handling capacity of the device 10 can be further improved so that the device 10 has a stable withstand voltage and a low on-state resistance. Additionally, the drift region also has a linearly graded doping profile which is composed of the N-- semiconductor layer 14 (i.e., the drift region) at its left side and the N-region 44b (i.e., the drift region extension) at its right side.

Figure 4:
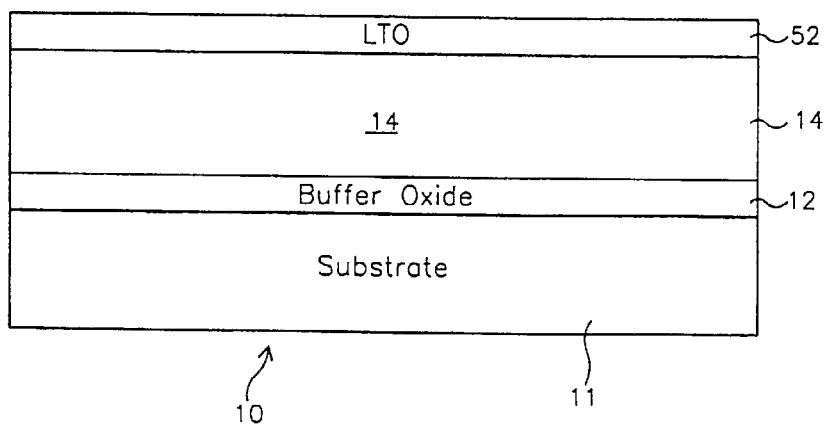
FIGS. 4–13 are cross-sectional views of intermediate structures illustrating a method of forming the device of FIG. 3, according to a second embodiment of the present invention.
Figure 5:
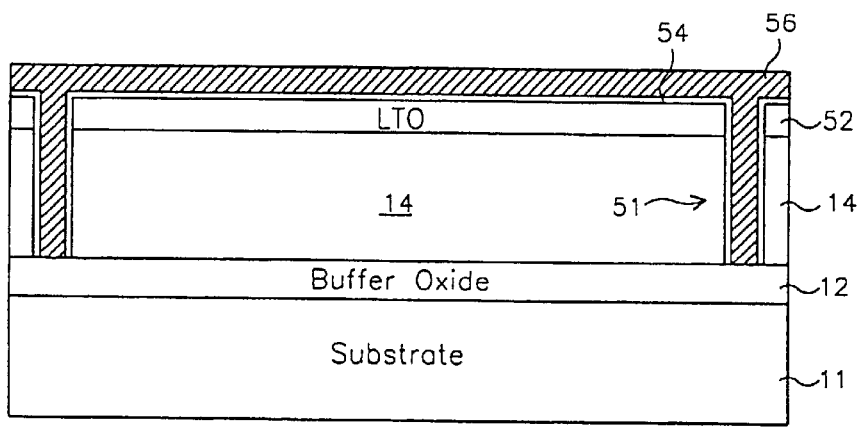
Figure 6:
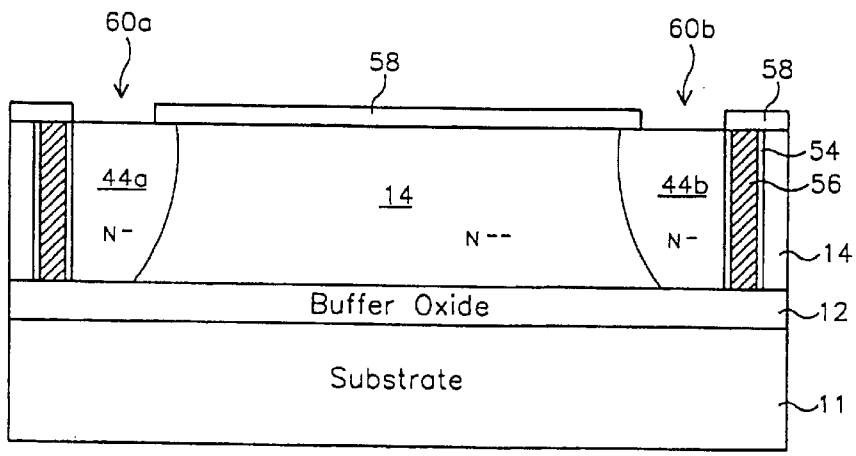

The following is a description of a preferred method of fabricating the device of FIG. 3. Referring first to FIG. 4, prepared is a semiconductor-on-insulator (SOI) substrate which has a silicon substrate 11, a buffer oxide layer 12 and a semiconductor layer 14. The semiconductor layer 14 can be lightly doped. On the SOI substrate, an oxide layer 52 of about 5000 Å thick (e.g., a low temperature oxide (LTO) layer) is thermally grown. In FIG. 5, a photoresist layer (not shown) is deposited on the SOI substrate and patterned by conventional photolithographic masking and developing techniques, leaving one or more portions of the photoresist layer to define a trench forming region. Next, when an etching process is performed using the remainder of the photoresist layer as a masking layer, a trench window is formed on the LTO layer 52. After removing the remaining photoresist layer, wet and dry etching processes well-known in the art are performed to remove one or more portions of the semiconductor layer 14 until an upper surface of the buffer oxide 12 is exposed and one or more trenches 51 are formed. Subsequently, oxidation and dry etching processes are sequentially carried out to form a thin oxide film 54 of about 4000 Å on both side walls of the respective trench 51 and on the LTO layer 52. After forming the thin oxide film 54, a polysilicon material is deposited on the thin oxide film 54, filling up the trench 51. With reference to FIG. 6, a planarization step is performed until an upper surface of the semiconductor layer 14 is exposed, and then an oxide layer 58 is formed on the semiconductor layer 14 and patterned by a photolithographic masking and etching technique to define a well forming mask with one or more windows 60a and 60b therein. Next, an ion implantation step using the well forming mask is performed to form N- well regions 44a and 44b in the semiconductor layer 14. Each of the well regions 44a and 44b formed thus functions as a portion of the drain region or the drift region of the transistor device.

Figure 7:
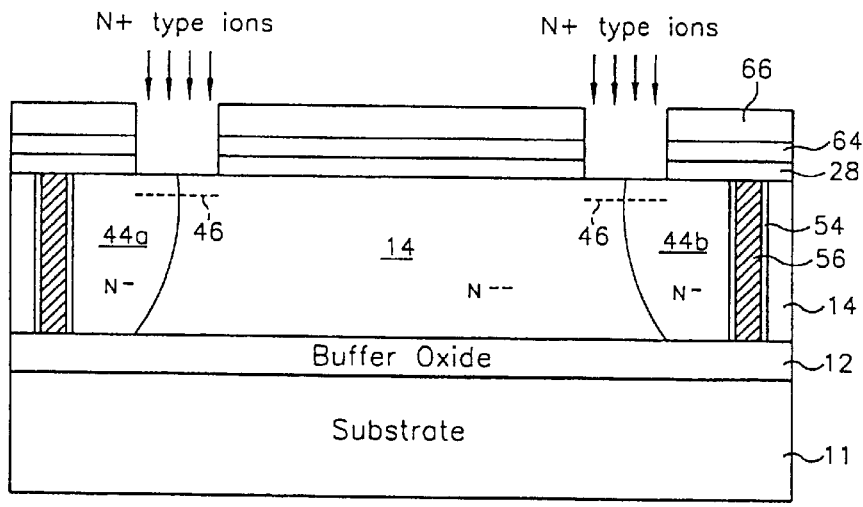

As illustrated in FIG. 7, after the well forming mask of the oxide layer 58 is removed, an oxide layer 28 for gate insulation is formed overlying the SOI substrate. Next, a nitride layer 64 (i.e., such as a $Si_3N_4$ layer) and a photoresist layer 66 are sequentially deposited on the gate insulating oxide layer 28, and then photolithographic masking and etching techniques are performed so that the nitride layer 64 is partially removed to define an opening therein. Ion implantation without a mask is then used to form an ion injected layer 46 of $N^0$ extending from a portion of the semiconductor layer 14 to a portion of the well regions 44a and 44b. This ion implantation step is performed at a dose level of about $1\times10^{13}$–$4\times10^{13}$ dopants $cm^{-2}$.

Figure 8:
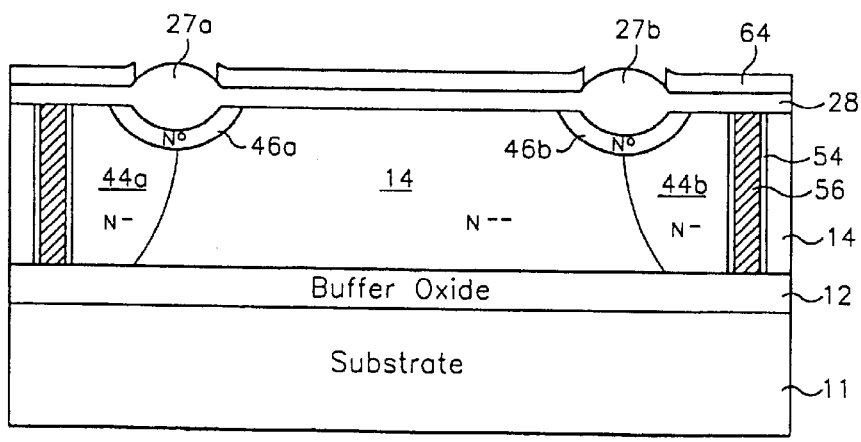

Referring to FIG. 8, after removing the photoresist layer 66, a well-known isolation type process such as LOCOS (Local Oxidation of Silicon) process is performed so that a field oxide layer 27a (or 27b) for device isolation is grown. During the growth of the oxide layer 27a, dopant ions in the ion injected layer 46 are diffused in the depth direction of the semiconductor layer 14 to form a drain region extension 46a.

Figure 9:
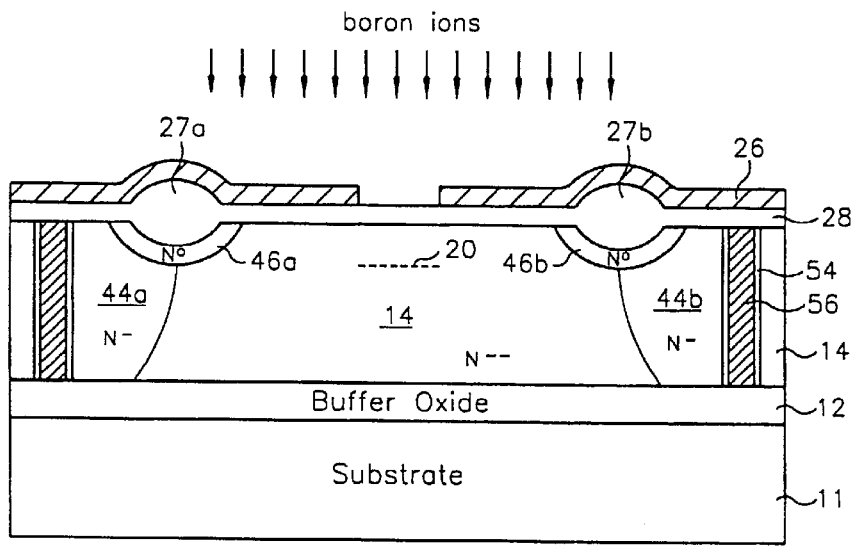
Figure 10:
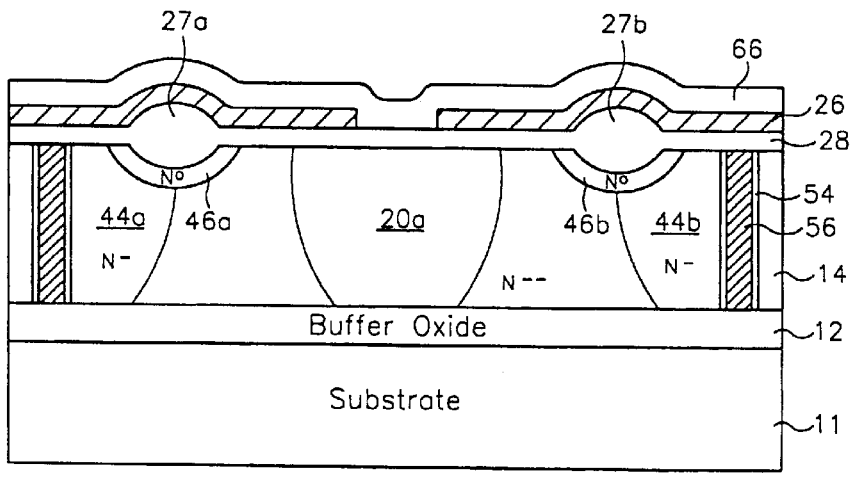
Figure 11:
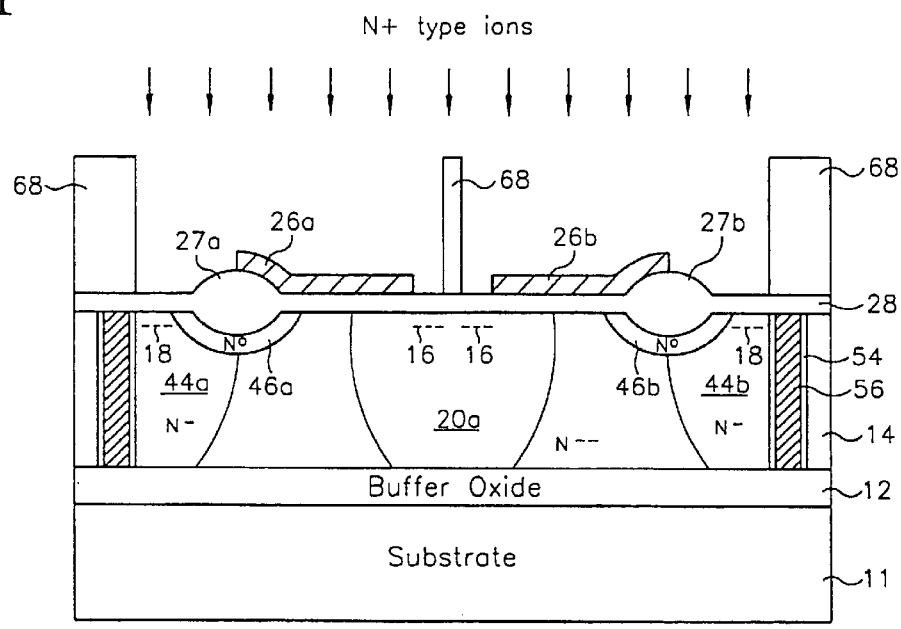
Figure 12:
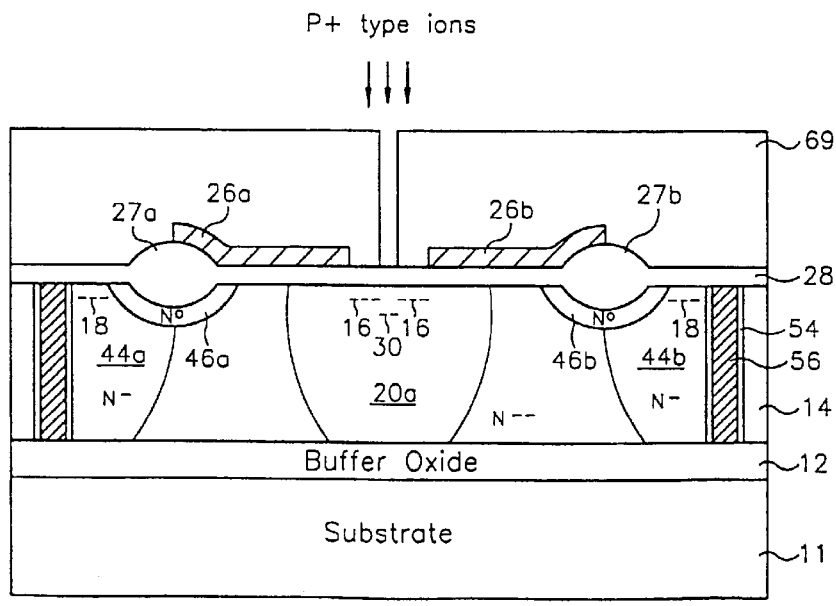
Figure 13:
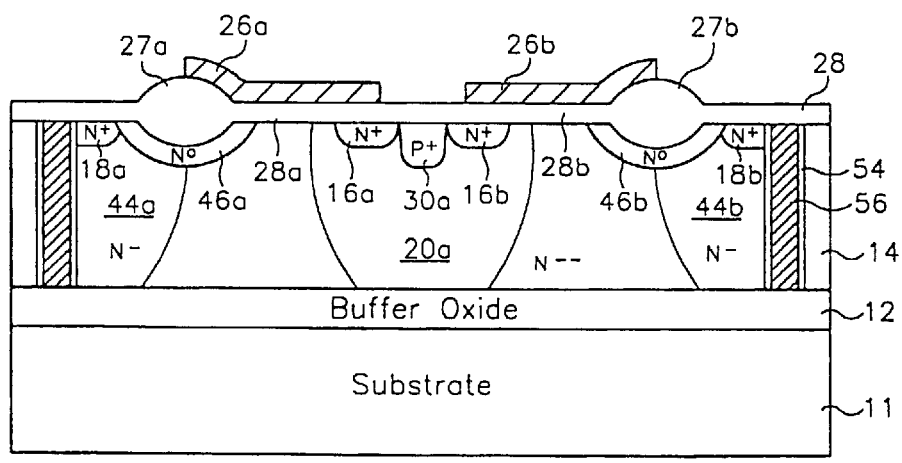

As illustrated in FIG. 9, after removing the nitride layer 64, a polysilicon layer 26 is deposited on the oxide layers 27b and 28, and then photolithographic masking and etching techniques are sequentially performed to form a PBODY window. Next, a boron ion implantation step is used to form an ion injected layer 20. A low temperature oxide (LTO) layer 66 is then grown on the polysilicon layer 26, covering the PBODY window, as shown in FIG. 10. Then, by thermal treatment, boron ions are diffused into the semiconductor layer 14 to form a PBODY 20a. In FIG. 11, after removing the LTO layer 66, the polysilicon layer 26 is patterned by photolithographic masking and etching techniques to form a gate electrode 26a and 26b. A photoresist layer 68 is then deposited covering the gate electrode and patterned to define source and drain forming regions. Next, an ion implantation step (using the patterned photoresist layer 68 as a mask) is used to form N+ ion injected layers 16 and 18. The ion injected layer 16 is formed within the PBODY 20a and the ion injected layer 18 is formed within the well region 44a. As illustrated in FIG. 12, after removing the photoresist layer 68, a photoresist layer 69 is again deposited on the substrate, and then patterned by well-known photolithographic masking and developing techniques in the art to define a P-type region. Subsequently, ion implantation is used to form a p+ ion injected layer 30. With reference to FIG. 13, after the removal of the photoresist layer 69, ions of the ion injected layers 16, 18 and 30 are diffused by a thermal treatment technique to simultaneously form the source region 16b, the drain region 18b and the p+ contact region 30a.

Referring now to FIG. 3, etching and metallization techniques are used to form openings on the oxide layer 28b and source/drain contacts 32b and 34, and to complete the structure illustrated in FIG. 3. An insulating layer 24b, such as silicon dioxide, is deposited over the device and conductive contacts and interconnect lines are formed to electrically couple the LDMOS transistor to other devices on the integrated circuit. As described above, according to a novel method of the present invention, a lateral DMOS transistor device can be fabricated which comprises a drift region having a linearly graded doping profile, and a drain region having a linearly graded doping profile. The device fabricated thus has a high breakdown voltage and is suitable as a power device because its drift region is longer than a drift region having a single doping profile. Also, because of the linearly graded doping profile of the drain region, the carrier mobility in the device can be improved and the process time of forming the drain region can be reduced as compared with the prior art.

A summary of preferred methods and devices will again be described with specific reference to FIGS. 3–13. In particular, preferred methods of forming lateral field effect transistors include the steps of implanting first conductivity type dopants at a first dose level (e.g., $1\times10^{13}$ cm$^{-2}$) into a first portion of a relatively lightly doped drift region of first conductivity type semiconductor 14 to form ion implant regions 46, as illustrated by FIG. 7. The first portion of the semiconductor drift region is then oxidized to form a relatively thick field oxide isolation region 27a–27b is and simultaneously form a drain region extension 46a–b of first conductivity type semiconductor (e.g., N$^{o}$) underneath the field oxide isolation region 27a–b by driving the dopants implanted at the first dose level into the drift region. A body region 20a of second conductivity type semiconductor (e.g., P-type) is then formed in a second portion of the semiconductor drift region 14 that is spaced from the first portion. A gate electrode 26a–b is then formed on the drift region 14 to extend opposite the body region 20a and the field oxide isolation region 27a–27b. Source and drain regions 16a–16b and 18a–18b, respectively, of first conductivity type semiconductor (e.g., N+) are then formed in the body region 20a and in a third portion of the drift region spaced from the second portion, respectively, by implanting first conductivity type dopants at a second dose level using the gate electrode 26a–26b and field oxide isolation region 27a–27b as an implant mask. The third portion of the drift region overlaps the first portion of the drift region so that a composite drain region having a laterally graded doping profile can be formed. In particular, the first portion of the drift region preferably extends between the third and second portions so that the doping profile of the drain region 18a–18b (e.g., N+) and drain region extension 46a–46b (e.g., N$^{o}$) monotonically decreases in a direction towards the body region 20a. To achieve this preferred graded doping profile in the drain region, the step of forming source and drain regions comprises implanting first conductivity type dopants at a second dose level that is greater than the first dose level.

According to other aspects of the present invention, the step of implanting first conductivity type dopants at a first dose level is preceded by the step of forming a gate oxide layer 28 on a surface of the drift region and the step of forming the body region is preceded by the step of forming a gate conductive layer 26 having an opening therein that extends opposite the second portion of the drift region, on the gate oxide layer 28 and field oxide isolation region 27a–27b. According to this aspect of the present invention, the step of forming the body region 20a comprises implanting dopants of second conductivity type at a third dose level into the drift region 14 using the gate conductive layer 26 as an implant mask. In addition, the step of forming a gate electrode 26a–26b comprises patterning the gate conductive layer 26 to expose a portion of the gate oxide layer 28 extending opposite the third portion of the drift region. The step of forming source and drain regions is also preferably preceded by the step of patterning a layer of photoresist 68 on the gate oxide layer, in the opening that extends opposite the second portion of the drift region 14. This patterned layer of photoresist is then removed from the opening and then implanting dopants of second conductivity type at a fourth dose level (greater than the third dose level) into the body region to define an ion implant region 30 and then these ions are diffused to form a contact region 30a of second conductivity type (e.g., P+) therein. According to still other aspects of the present invention, the lateral field effect transistors according to the present invention are formed in semiconductor-on-insulator (SOI) substrates. Thus, the step of implanting first conductivity type dopants at a first dose level is preceded by the step of forming an SOI substrate containing a semiconductor substrate 11, a buffer oxide layer 12 on the semiconductor substrate and a drift region 14 of first conductivity type semiconductor of predetermined thickness on the buffer oxide layer 12, opposite the semiconductor substrate 11. Here, the step of implanting first conductivity type dopants at a first dose level may be preceded by the steps of forming a trench 51 extending through the drift region to expose the buffer oxide layer; lining the trench with an electrically insulating layer 54 and then filling the trench with an electrically conductive layer 56. The step of implanting first conductivity type dopants at a first dose level may also be preceded by the steps of implanting first conductivity type dopants at a fifth dose level into the first portion of the drift region and then driving the dopants implanted at the fifth dose level into the drift region to form a drift region extension 44a–44b therein. The drift region 14 and drift region extension 44a–44b collectively form a region having a laterally graded doping profile which decreases monotonically in a direction towards the body region of second conductivity type.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a field effect transistor, comprising the steps of:

implanting first conductivity type dopants at a first dose level into a first portion of a drift region of first conductivity type semiconductor;

oxidizing the first portion of the semiconductor drift region to form a field oxide isolation region and simultaneously form a drain region extension of first conductivity type semiconductor by driving the dopants implanted at the first dose level into the drift region;

forming a body region of second conductivity type semiconductor in a second portion of the semiconductor drift region, spaced from the first portion;

forming a gate electrode extending opposite the body region and field oxide isolation region; and forming source and drain regions of first conductivity type semiconductor in the body region and in a third portion of the drift region spaced from the second portion, respectively, by implanting first conductivity type dopants at a second dose level which is greater than the first dose level using the gate electrode and field oxide isolation region as an implant mask;

wherein said step of implanting first conductivity type dopants at a first dose level is preceded by the step of forming a gate oxide layer on a surface of the drift region; wherein said step of forming a body region is preceded by the step of forming a gate conductive layer having an opening therein that extends opposite the second portion of the drift region, on the gate oxide layer and field oxide isolation region; and wherein said step of forming a body region comprises implanting dopants of second conductivity type at a third dose level into the drift region using the gate conductive layer as an implant mask.

2. The method of claim 1, wherein said step of forming a gate electrode comprises patterning the gate conductive layer to expose a portion of the gate oxide layer extending opposite the third portion of the drift region.

3. The method of claim 2, wherein said step of forming source and drain regions is preceded by the step of patterning a layer of photoresist on the gate oxide layer, in the opening that extends opposite the second portion of the drift region.

4. The method of claim 3, further comprising the steps of removing the patterned layer of photoresist from the opening and then implanting dopants of second conductivity type at a fourth dose level into the body region to define a contact region of second conductivity type therein.

5. The method of claim 4, wherein the fourth dose level is greater than the third dose level.

6. A method of forming a field effect transistor, comprising the steps of:
   implanting first conductivity type dopants at a first dose level into a first portion of a drift region of first conductivity type semiconductor;
   oxidizing the first portion of the semiconductor drift region to form a field oxide isolation region and simultaneously form a drain region extension of first conductivity type semiconductor by driving the dopants implanted at the first dose level into the drift region;
   forming a body region of second conductivity type semiconductor in a second portion of the semiconductor drift region, spaced from the first portion;
   forming a gate electrode extending opposite the body region and field oxide isolation region; and
   forming source and drain regions of first conductivity type semiconductor in the body region and in a third portion of the drift region spaced from the second portion, respectively, by implanting first conductivity type dopants at a second dose level which is greater than the first dose level using the gate electrode and field oxide isolation region as an implant mask;
   wherein said step of implanting first conductivity type dopants at a first dose level is preceded by the step of forming an SOI substrate containing a semiconductor substrate, a buffer oxide layer on the semiconductor substrate and a drift region of first conductivity type semiconductor on the buffer oxide layer, opposite the semiconductor substrate.

7. The method of claim 6, wherein said step of implanting first conductivity type dopants at a first dose level is preceded by the steps of forming a trench extending through the drift region to expose the buffer oxide layer; lining the trench with an electrically insulating layer and then filling the trench with an electrically conductive layer.

8. The method of claim 7, wherein said step of implanting first conductivity type dopants at a first dose level is preceded by the steps of implanting first conductivity type dopants at a fifth dose level into the first portion of the drift region and then driving the dopants implanted at the fifth dose level into the drift region to define a drift region extension therein.

9. A method of forming a lateral insulated-gate field effect transistor, comprising the steps of:
   forming a gate oxide layer on a drift region of first conductivity type semiconductor;
   forming a trench in the drift region;
   lining the trench with an electrically insulating layer;
   filling the trench with polysilicon;
   implanting first conductivity type dopants at a first dose level into a first portion of the drift region;
   oxidizing the first portion of the semiconductor drift region to form a field oxide isolation region that adjoins the gate oxide layer and simultaneously form a drain region extension of first conductivity type semiconductor by driving the dopants implanted at the first dose level into the drift region;
   forming a gate conductive layer having an opening therein that extends opposite a second portion of the drift region;
   forming a body region of second conductivity type semiconductor in a second portion of the semiconductor drift region, spaced from the first portion, by implanting dopants of second conductivity type at a third dose level into the drift region using the gate conductive layer as an implant mask;
   patterning the gate conductive layer to form a gate electrode that extends opposite the body region and the field oxide isolation region; and
   forming source and drain regions of first conductivity type semiconductor in the body region and in a third portion of the drift region spaced from the second portion, respectively, by implanting first conductivity type dopants at a second dose level greater than the first dose level using the gate electrode and field oxide isolation region as an implant mask so that the source region is self-aligned to the gate electrode and the drain region is self-aligned to the field oxide isolation region but not self-aligned to the gate electrode.

10. A method of forming a lateral insulated-gate field effect transistor, comprising the steps of:
   forming a gate oxide layer on a drift region of first conductivity type semiconductor;
   implanting first conductivity type dopants at a first dose level into a first portion of the drift region;
   oxidizing the first portion of the semiconductor drift region to form a field oxide isolation region that adjoins the gate oxide layer and simultaneously form a drain region extension of first conductivity type semiconductor by driving the dopants implanted at the first dose level into the drift region;
   forming a gate conductive layer having an opening therein that extends opposite a second portion of the drift region;
   forming a body region of second conductivity type semiconductor in a second portion of the semiconductor drift region, spaced from the first portion, by implanting dopants of second conductivity type at a third dose level into the drift region using the gate conductive layer as an implant mask;
   patterning the gate conductive layer to form a gate electrode that extends opposite the body region and the field oxide isolation region; and forming source and drain regions of first conductivity type semiconductor in the body region and in a third portion of the drift region spaced from the second portion, respectively, by implanting first conductivity type dopants at a second dose level which is greater than the first dose level using the gate electrode and field oxide isolation region as an implant mask;

wherein said step of implanting first conductivity type dopants at a first dose level is preceded by the steps of forming a trench in the drift region; lining the trench with an electrically insulating layer and then filling the trench with an electrically conductive layer.

11. The method of claim 10, wherein said step of implanting first conductivity type dopants at a first dose level is preceded by the steps of implanting first conductivity type dopants at a fifth dose level into the first portion of the drift region and then driving the dopants implanted at the fifth dose level into the drift region to define a drift region extension therein.

12. The method of claim 6, wherein said step of implanting first conductivity type dopants at a first dose level is preceded by the steps of forming a trench extending through the drift region to expose the buffer oxide layer; lining the trench with an electrically insulating layer and then filling the trench with polysilicon.

13. A method of forming a lateral insulated-gate field effect transistor, comprising the steps of:

forming a gate oxide layer on a drift region of first conductivity type semiconductor;

implanting first conductivity type dopants at a first dose level into a first portion of the drift region;

oxidizing the first portion of the semiconductor drift region to form a field oxide isolation region that adjoins the gate oxide layer and simultaneously form a drain region extension of first conductivity type semiconductor by driving the dopants implanted at the first dose level into the drift region;

forming a gate conductive layer having an opening therein that extends opposite a second portion of the drift region;

forming a body region of second conductivity type semiconductor in a second portion of the semiconductor drift region, spaced from the first portion, by implanting dopants of second conductivity type at a third dose level into the drift region using the gate conductive layer as an implant mask;

patterning the gate conductive layer to form a gate electrode that extends opposite the body region and the field oxide isolation region; and forming source and drain regions of first conductivity type semiconductor in the body region and in a third portion of the drift region spaced from the second portion, respectively, by implanting first conductivity type dopants at a second dose level which is greater than the first dose level using the gate electrode and field oxide isolation region as an implant mask;

wherein said step of implanting first conductivity type dopants at a first dose level is preceded by the steps of forming a trench in the drift region; lining the trench with an electrically insulating layer and then filling the trench with polysilicon.

* * * * *